United States Patent
Suh (10) Patent No.: US 6,869,872 B2
(45) Date of Patent: Mar. 22, 2005

(54) METHOD OF MANUFACTURING A SEMICONDUCTOR MEMORY DEVICE HAVING A METAL CONTACT STRUCTURE

(75) Inventor: Chunsuk Suh, Suwon (KR)

(73) Assignee: Samsung Electronics., Co., Ltd., Kyungki-Do (KR)

( * ) Notice: Subject to any disclaimer, the term of this patent is extended or adjusted under 35 U.S.C. 154(b) by 0 days.

(21) Appl. No.: 10/635,378

(22) Filed: Aug. 6, 2003

(65) Prior Publication Data
US 2004/0026726 A1 Feb. 12, 2004

Related U.S. Application Data

(62) Division of application No. 09/838,355, filed on Apr. 19, 2001, now Pat. No. 6,683,339.

(30) Foreign Application Priority Data
Nov. 8, 2000 (KR) .................................... 2000-0066171

(51) Int. Cl.⁷ ........................................... H01L 21/4763
(52) U.S. Cl. .................. 438/626; 438/241; 438/258; 438/618; 438/620; 438/637; 438/622; 438/238; 438/386; 438/399; 438/250; 438/239; 257/296
(58) Field of Search ................................. 438/238, 239, 438/386, 399, 250, 626, 241, 258, 618, 620, 637, 622; 257/296

(56) References Cited

U.S. PATENT DOCUMENTS 6,037,216 A * 3/2000 Liu et al. ..................... 438/253
6,150,689 A * 11/2000 Narui et al. ................ 257/306
6,238,971 B1 * 5/2001 Parekh et al. ............... 438/255

* cited by examiner

Primary Examiner—Eddie Lee
Assistant Examiner—Junghwa M. Im
(74) Attorney, Agent, or Firm—F. Chau & Associates, LLC (57) ABSTRACT

The present invention discloses a semiconductor memory device having a bit line and a metal contact stud, wherein the metal contact stud is formed on a different layer from a layer on which the bit lines are formed.

20 Claims, 8 Drawing Sheets

METHOD OF MANUFACTURING A SEMICONDUCTOR MEMORY DEVICE HAVING A METAL CONTACT STRUCTURE

This application is a divisional of Ser. No. 09/838,355 filed Apr. 19, 2001, now U.S. Pat. No. 6,683,389.

BACKGROUND OF THE INVENTION

This application claims the benefit of Korean Patent Application No. 2000-66171, filed on Nov. 8, 2000, under 35 U.S.C. § 119, the contents of which are herein incorporated by reference in their entirety.

1. Technical Field

The present invention generally relates to a semiconductor memory device, and more particularly, to a semiconductor memory device having a metal contact structure and a method of manufacturing the same.

2. Discussion of Related Art

In semiconductor memory devices such as dynamic random access memory (DRAM) devices, a metal contact serves to connect a metal line with various components including, for example, an active area, a gate electrode, a bit line, and an upper electrode of a capacitor. The metal contact is usually disposed on a periphery region of the semiconductor memory device.

The basic memory cell of a dynamic RAM device, which includes a single transistor and a capacitor is small and a very dense array can be made using these cells. The major cost of a semiconductor memory is usually the cost of the silicon wafer, thus, the more chips on a wafer, the lower cost per chip. Dynamic RAMs therefore have a lower cost per bit than memories with less compact arrays.

Figure 1:
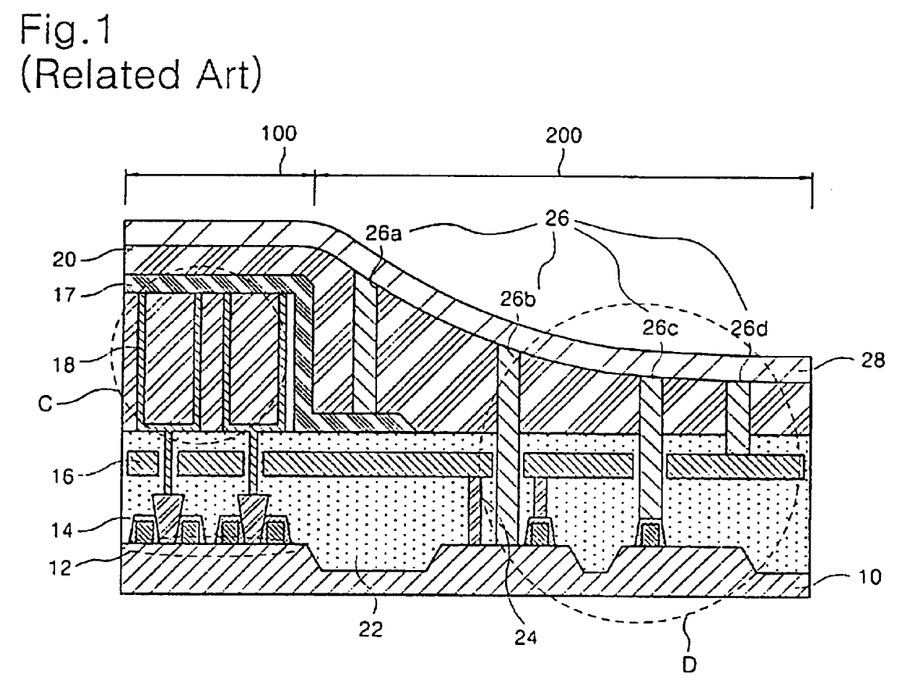
FIG. 1 is an exemplary cross-sectional view illustrating a semiconductor memory device having a metal contact structure according to a conventional art.

FIG. 1 is a cross-sectional view illustrating a conventional semiconductor memory device having a metal contact structure. As shown in FIG. 1, the memory device includes a cell region 100 and a periphery region 200. In the cell region 100, a gate electrode 14 is disposed on an active area 12 of a silicon substrate 10. The silicon substrate 10 and an active area 12 are integrally formed, and protruding portions of the substrate 10 are used as the active area (i.e., a channel area) 12. Bit lines 16 and a capacitor C are formed over the gate electrode 14. The capacitor C includes upper and lower electrodes 17 and 18. A first metal contact 26a is disposed to contact a metal line 28 with the upper electrode 17 of the capacitor C.

In the periphery region 200, bit line contacts 24 are disposed to respectively connect the bit lines 16 with the active area 12 and the gate electrode 14. Second metal contact 26b and third metal contact 26c are formed in metal contact holes that are each between adjacent bit lines 16, to connect the metal line 28 with the active area 12 and the gate electrode 14, respectively. Also, a fourth metal contact 26d connects the metal line 28 with the bit line 16. First insulating layer 20 and second insulating layer 22 electrically insulate the components described above from each other, and are preferably made of an oxide such as, for example, SiOx.

The metal contacts 26 are usually formed after forming the upper electrode 17 of the capacitor 18. At this time, the metal contacts should precisely be aligned with the active area 12, the gate electrode 14, and the bit lines 16, which have already been formed. Since the alignment margin is relatively large in the areas where the first metal contact 26a connects the metal line 28 with the upper electrode 17 of the capacitor C, and where the fourth metal contact 26d connects the metal line 28 with the bit line 16, a very precise alignment is not required. On the other hand, the second metal contact 26b and third metal contact 26c each require a very precise alignment with the active area 12, the gate electrode 14, and the bit lines 16. As a chip size becomes smaller, the second and third metal contacts 26b and 26c disposed on the periphery region 200 have an increasingly narrow alignment margin with the active area 12, the gate electrode 14, and the bit lines 16. Therefore, the semiconductor manufacturing process, especially the photolithography process, becomes more difficult.

Figure 2:
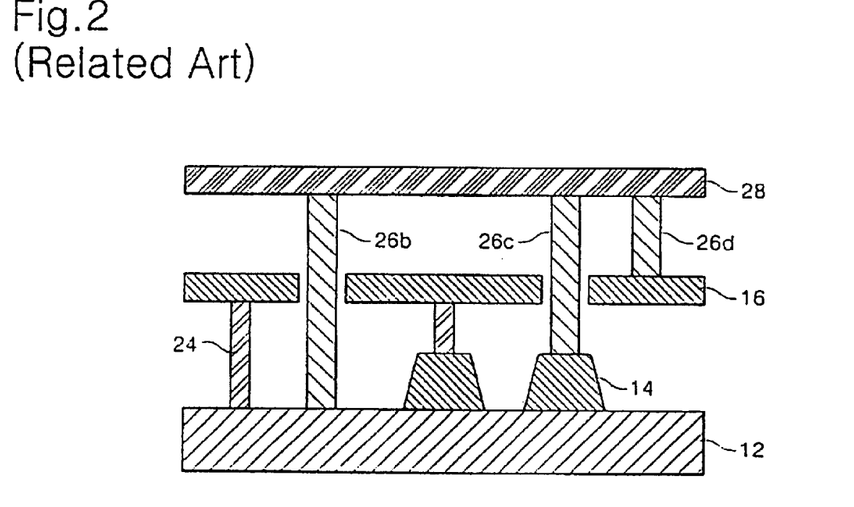
FIG. 2 is an enlarged view illustrating a portion D of FIG. 1.

FIG. 2 is an enlarged view illustrating a portion D of FIG. 1. The metal line 28 disposed on the periphery region 200 is connected with the active area 12 and the gate electrode 14 via the second and third metal contacts 26b and 26c, respectively. As described above, the second and third metal contacts 26b and 26c should each be disposed between two adjacent bit lines 16. As a chip size becomes smaller, an alignment margin thus becomes reduced; therefore, a short circuit between the metal contacts 26b and 26c and the neighboring bit line 16 is more likely to occur due to a misalignment.

In efforts to try to overcome the problem described above, a metal contact stud technique may be used.

Figure 3:
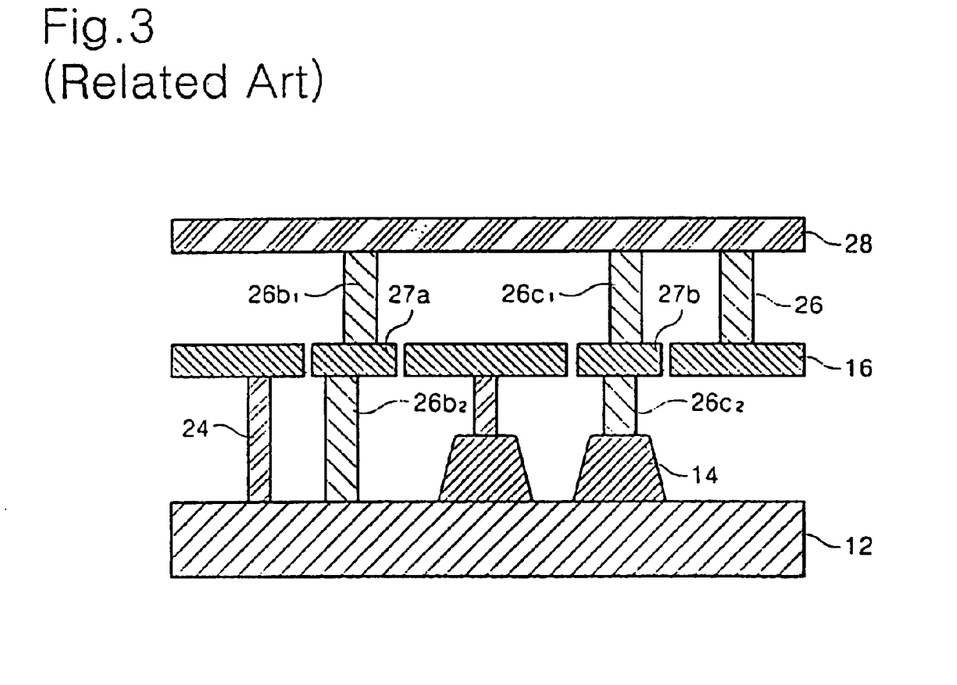
FIGS. 3 and 4 are exemplary cross-sectional views illustrating a semiconductor memory device having a modified metal contact structure according to the conventional art.
Figure 4:
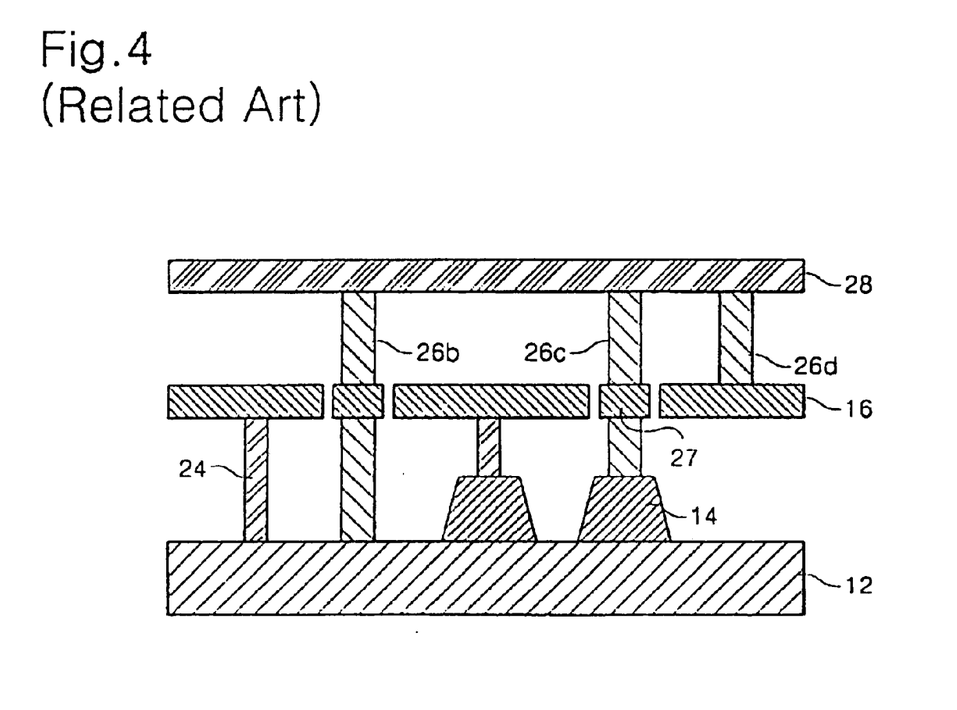

FIGS. 3 and 4 are exemplary cross-sectional views illustrating a conventional semiconductor memory device having a metal contact structure using a metal contact stud. As shown in FIG. 3, metal contact studs 27a and 27b connect upper and lower portions $26b_1$, and $26b_2$ of the second metal contact 26b, and upper and lower portions $26c_1$ and $26c_2$ of the third metal contact 26c, respectively. The metal contact studs 27a and 27b are formed at the same time as the bit lines 16 following the formation of the lower portions $26b_2$ and $26c_2$ of the second and third metal contacts 26b and 26c, respectively. After forming the metal contact studs 27a and 27b, the upper portions $26b_1$ and $26c_1$ of the second and third metal contacts 26b and 26c are connected, respectively, with the lower portions $26b_2$ and $26c_2$ of the second and third metal contacts 26b and 26c via the metal contact studs 27a and 27b. As a result, an alignment margin is increased.

However, as shown in FIG. 4, as a chip size becomes smaller, a gap between the adjacent two bit lines 16 becomes increasingly narrow; it thus becomes very difficult to secure sufficient space to dispose the metal contact stud 27. This results in a very difficult manufacturing process and a low manufacturing yield.

Accordingly, a need exists for a semiconductor memory having a metal contact structure that can secure sufficient space to dispose the metal contact stud, and which has an improved manufacturing process and a high manufacturing yield.

SUMMARY OF THE INVENTION

According to an aspect of the present invention, a semiconductor memory device is provided having bit lines and a metal contact stud, wherein the metal contact stud is formed on a different layer from a layer on which the bit lines are formed.

Preferably, the metal contact studs are formed under the bit lines. In addition, a lower portion of the metal contact stud is preferably smaller in area than an upper portion thereof.

In one aspect of the present invention, a semiconductor memory device is provided comprising: a metal contact formed in between adjacent bit lines, said metal contact having an upper portion and a lower portion thereof; and a metal contact stud for connecting said upper portion to the lower portion, wherein the metal contact stud is formed on a different layer from a layer on which the bit lines are formed.

In another aspect of the present invention, a method of manufacturing a semiconductor device is provided comprising the steps of: a) forming gate electrodes on a substrate having a cell region and a periphery region; b) forming a first insulating layer over the substrate, the first insulating layer covering the gate electrodes; c) forming first metal contact holes and stud holes in the first insulating layer; d) forming metal contact studs and first metal contact portions in the stud holes and the first metal contact holes, respectively; e) forming a second insulating layer on the first insulating layer and on the metal contact studs; f) forming bit line contact holes passing through the first and second insulating layers; g) forming bit line contacts in the bit line contact holes; and h) forming bit lines on the second insulating layer.

Advantageously, since the metal contact studs of the present invention are formed on the different layer from the layer on which the bit lines are formed, an alignment margin to form the metal contacts is increased. Therefore, for example, a short circuit between the metal contacts and the bit lines due to a misalignment can be prevented, leading to a high manufacturing yield.

These and other aspects, features, and advantages of the present invention will be described or become apparent from the following detailed description of preferred embodiments, which is to be read in connection with the accompanying drawings.

DETAILED DESCRIPTION OF PREFERRED EMBODIMENTS

Reference will now be made in detail to a preferred embodiment of the present invention, example of which is illustrated in the accompanying drawings.

Figure 5:
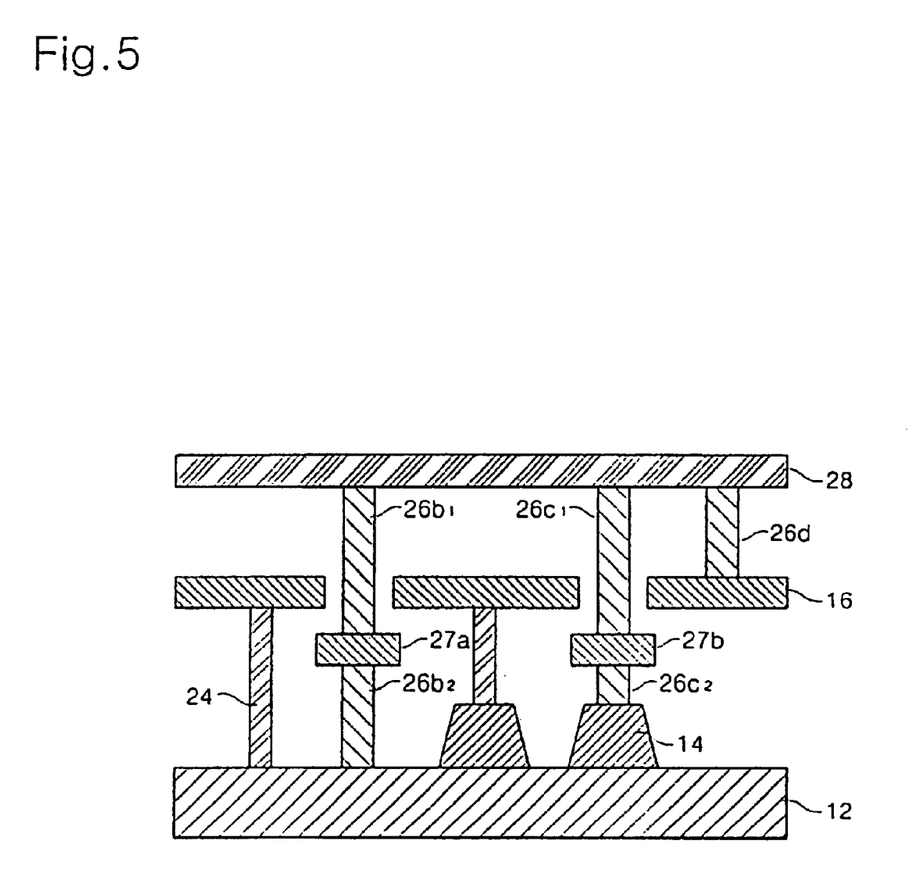
FIG. 5 is an exemplary cross-sectional view illustrating a periphery region of a semiconductor memory device having a metal contact structure according to a preferred embodiment of a present invention.

FIG. 5 is an exemplary cross-sectional view illustrating a periphery region of a semiconductor memory device having a metal contact structure according to the preferred embodiment of the present invention. As shown in FIG. 5, the metal line 28 disposed on the periphery region 200 (see FIG. 1) is respectively connected with the active area 12, the gate electrode 14, and the bit line 16 via the second to fourth metal contacts 26b to 26d, respectively. Metal contact studs 27a and 27b connect upper and lower portions $26b_1$ and $26b_2$ of the second metal contact 26b and upper and lower portions $26c_1$ and $26c_2$ of the third metal contact 26c, respectively. At this point, the metal contact studs 27a and 27b are formed on a different layer from a layer on which the bit lines 16 are formed and have a wider width than the bit lines 16, according to a preferred embodiment of the present invention. Preferably, the metal contact studs 27a and 27b are formed under the bit lines 16.

Hereinafter, a process of manufacturing the semiconductor memory device having the metal contact structure according to the preferred embodiment of the present invention is explained in detail with reference to FIGS. 6 to 19. FIGS. 6 to 19 are exemplary cross-sectional views illustrating a process of manufacturing the semiconductor memory device having the metal contact structure according to a preferred embodiment of the present invention.

Figure 6:
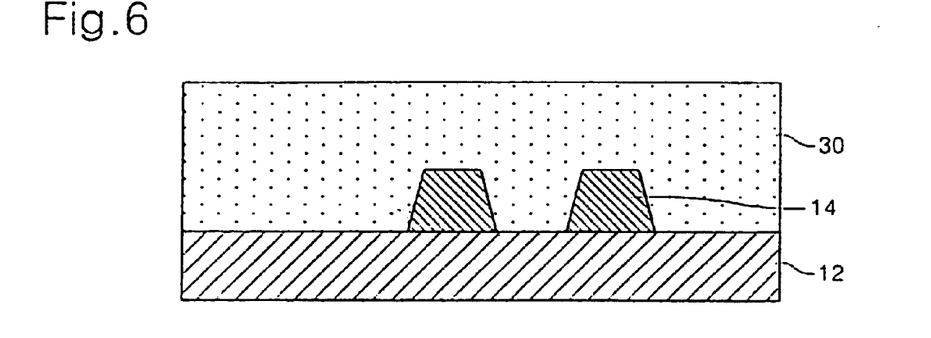
FIGS. 6 to 19 are exemplary cross sectional views illustrating a process of manufacturing a semiconductor memory device having a metal contact structure according to a preferred embodiment of the present invention.
Figure 7:
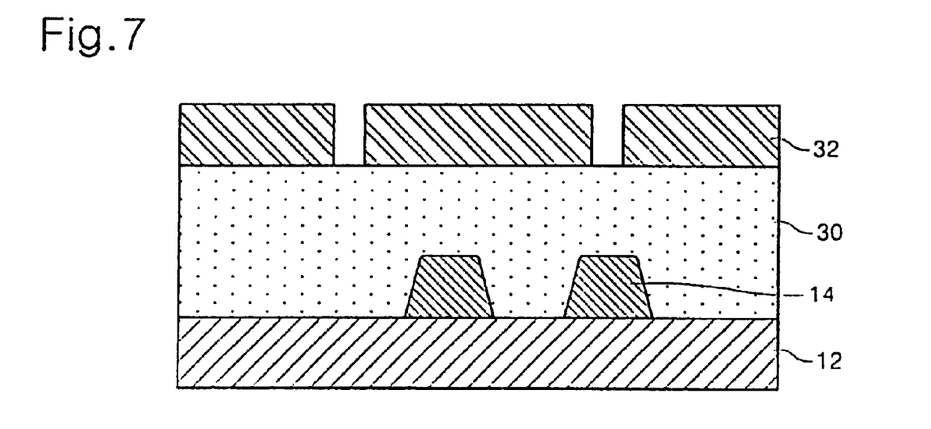
Figure 8:
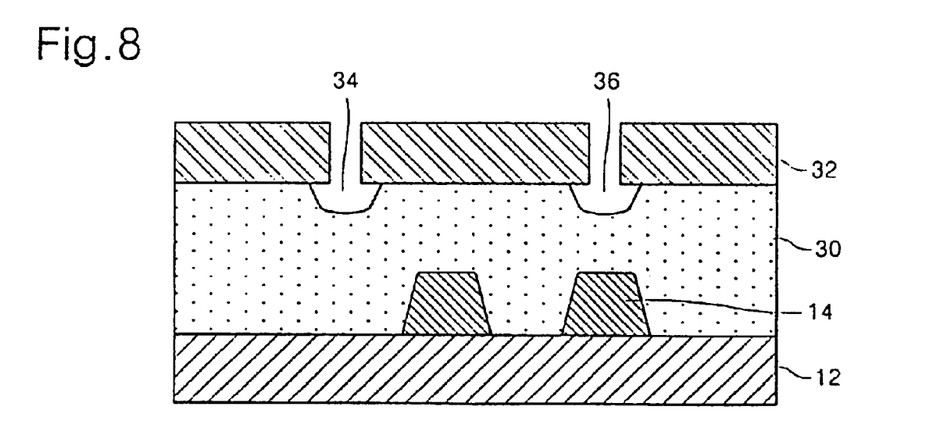

First, as shown in FIG. 6, gate electrodes 14 are formed on the active area 12 of the silicon substrate 10 (see FIG. 1), and then a first insulating layer 30 is formed over the whole surface of the substrate 10 while covering the gate electrodes 14. A surface of the first insulating layer 30 is planarized using, for example, a chemical-mechanical polishing (CMP) technique. Then, as shown in FIG. 7, first photoresist patterns 32 are formed on the first insulating layer 30 using a photolithography process. Thereafter, as shown in FIG. 8, stud holes 34 and 36 are formed by an isotropic dry or an isotropic wet etching technique using the first photoresist patterns 32 as a mask. While an overall area size of each metal contact stud depends on the isotropic etching process used, an area of the lower portion of the metal contact studs 27a and 27b is smaller than an area of the upper portion thereof.

Figure 9:
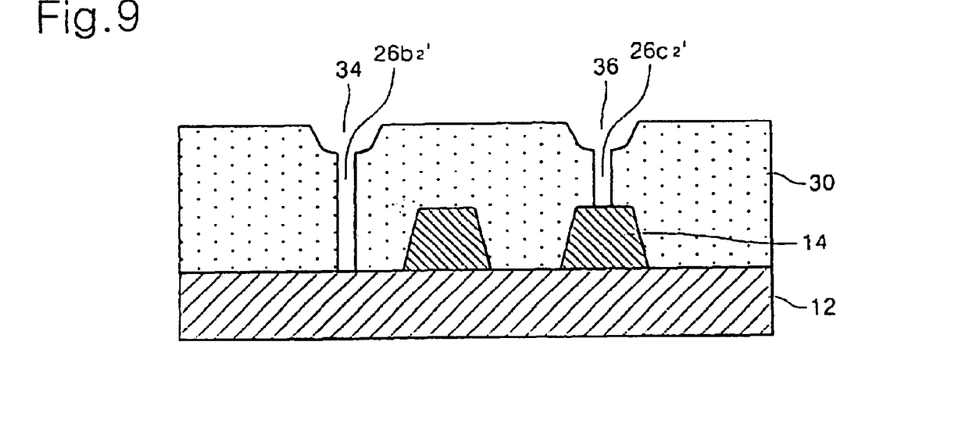

Subsequently, as shown in FIG. 9, using anisotropic etching processing, first metal contact holes $26b_2'$ and $26c_2'$ are formed on the active area 12 and the gate electrode 14 before the first photoresist patterns 32 are removed.

Figure 10:
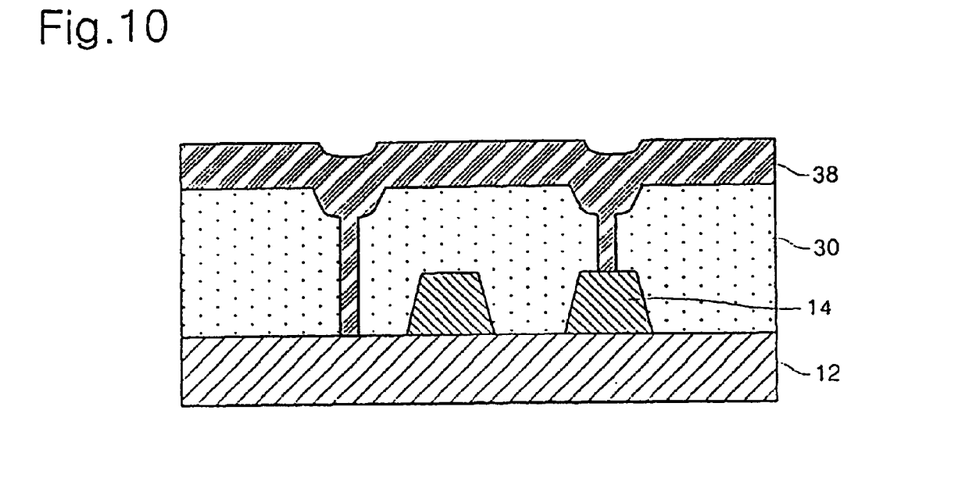

Referring to FIG. 10, a first conductive material layer 38 is deposited on the first insulating layer 30 while filling the stud holes 34 and 36 and the first metal contact holes $26b_2'$ and $26c_2'$. The first conductive material layer 38 is preferably made of, for example, tungsten or polycrystalline silicon.

Figure 11:
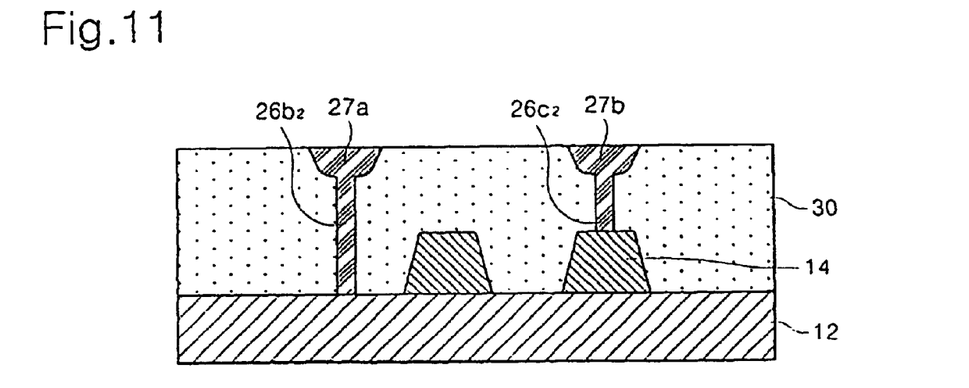

A portion of the first conductive material layer 38 on the first insulating layer 30 is then removed using, for example, the CMP technique to form the first and second metal contact studs 27a and 27b and the lower portions $26b_2$ and $26c_2$ of the metal contacts 26b and 26c as shown in FIG. 11.

Figure 12:
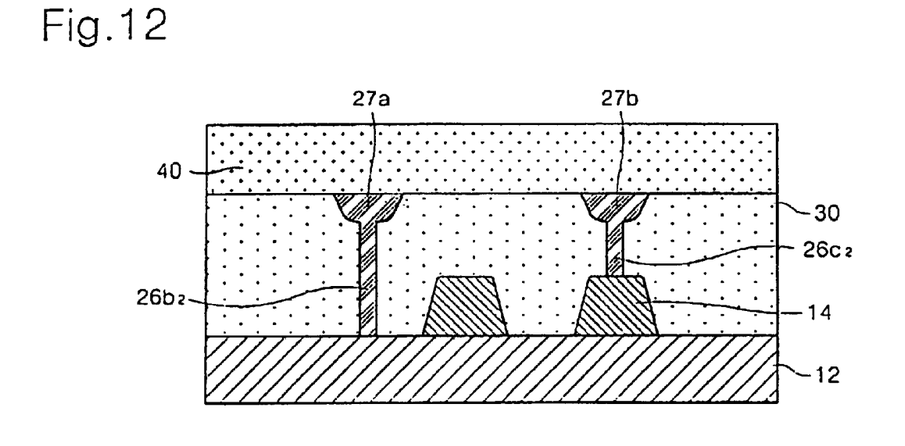

Subsequently, as shown in FIG. 12, a second insulating layer 40 is formed on the whole surface of the first insulating layer 30 and over the first and second metal contact studs 27a and 27b. The second insulating layer 40 is then planarized using the CMP technique.

Figure 13:
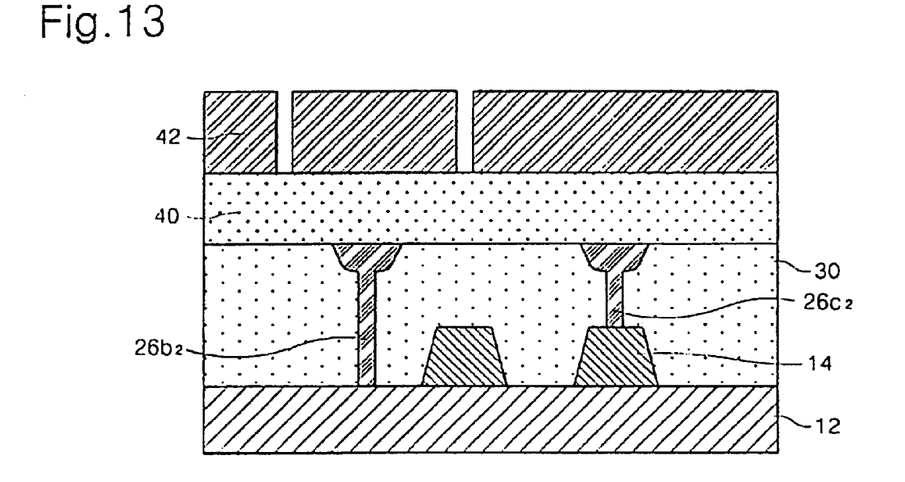
Figure 14:
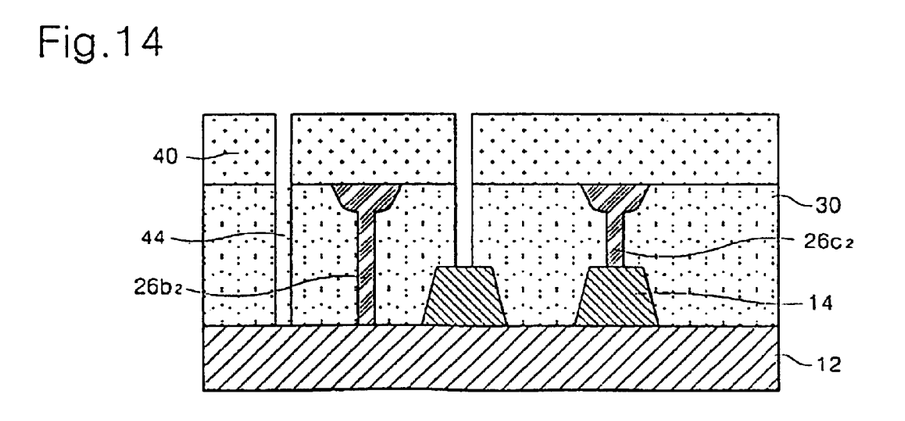

Then, as shown in FIG. 13, second-photoresist patterns 42 are formed on the second insulating layer 40 using the photolithography process. As shown in FIG. 14, using the second photoresist patterns 42 as a mask, the first and second insulating layers 30 and 40 are isotropically-etched to form bit line contact holes 44. The second photoresist patterns 42 are then removed.

Figure 15:
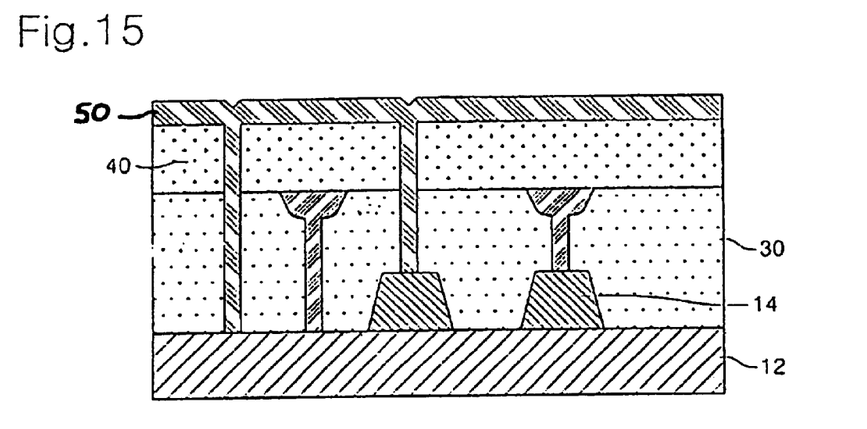

As shown in FIG. 15, a second conductive material layer 50 is deposited on the second insulating layer 40 while filling the bit line contact holes 44. The second conductive material layer 50 is preferably made of, for example, tungsten or polycrystalline silicon.

Figure 16:
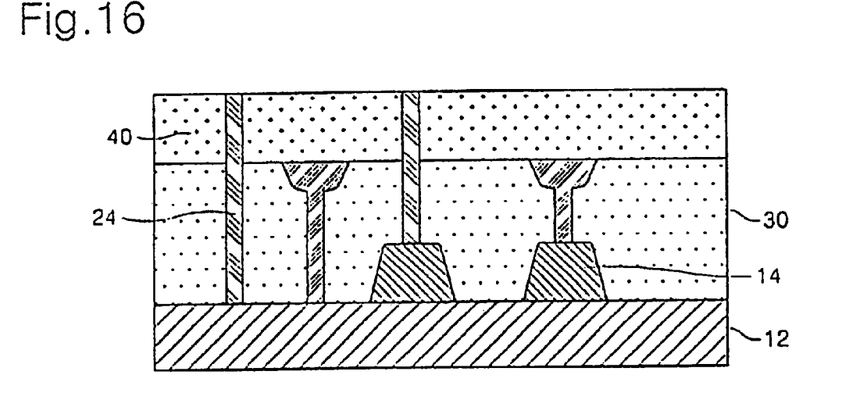
Figure 17:
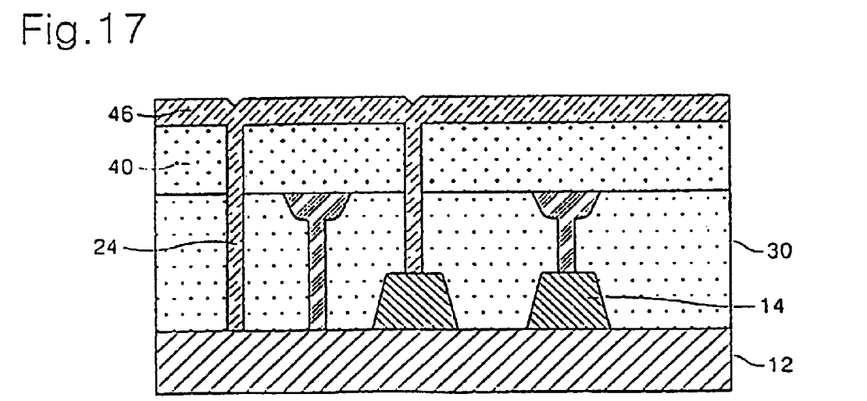

As shown in FIG. 16, a portion of the second material layer 50 on the second insulating layer 40 is removed using, for example, the CMP technique, to form the bit line contacts 24. At least one of the bit line contacts 24 is connected with the active area 12, while at least another one of the bit line contacts 24 is connected to the gate electrode 14. As shown in FIG. 17, a third conductive material layer 46 is deposited on the second insulating layer 40 and contacts the bit line contacts 24. The third conductive material layer 46 is preferably made of, for example, either tungsten or polycrystalline silicon.

Figure 18:
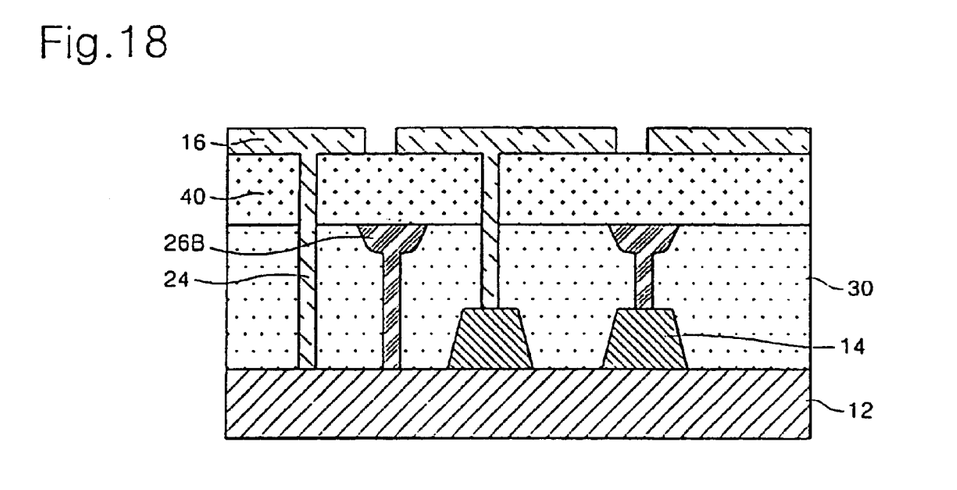
Figure 19:
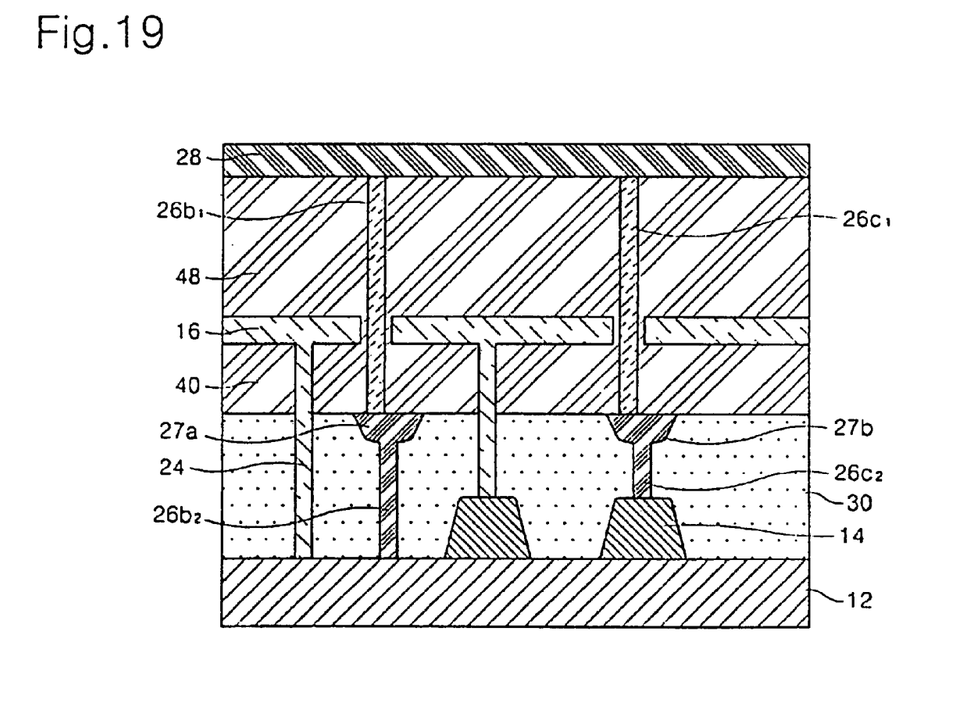

As shown in FIG. 18, the third conductive material layer 46 is patterned to form the bit lines 16. As shown in FIG. 19, a capacitor is then formed on the cell region 100 (see C in FIG. 1), and then a third insulating layer 48 is formed over the whole surface of the substrate 10. The third insulating layer 48 serves as an interlayer insulator. Then, third photoresist patterns (not shown) are formed on the third insulating layer 48. Using the third photoresist patterns as a mask, the interlayer insulator 48 and the second insulating layer 40 are isotropically-etched to form second metal contact hole $26b_1$ and third metal contact hole $26c_1$ that each pass through between adjacent bit lines 16 and expose a portion of the first and second metal contact studs 27a and 27b. A fourth conductive material layer (not shown) is deposited on the third insulating layer 48 and fills the second and third metal contact holes 26b1 and 26c1. A portion of the fourth conductive material layer on the third insulating layer 48 is then removed to form the upper portions $26b_1$ and $26c_1$ of the second and third metal contacts 26b and 26c.

Subsequently, a fifth conductive material layer is deposited and then patterned to form the metal line 28 using the photolithography process. The metal line 28 is preferably made of a conductive material such as, for example, tungsten and/or aluminum. Therefore, the semiconductor memory device having the metal contact structure according to a preferred embodiment of the present invention is completed.

Advantageously, since the metal contact studs are formed on a different layer from the layer on which the bit lines are formed, an alignment margin to form the metal contacts is increased. Therefore, for example, a short circuit between the metal contacts and the bit lines due to a misalignment can be prevented, thus leading to a high manufacturing yield.

Although illustrative embodiments of the present invention have been described herein with reference to the accompanying drawings, it is to be understood that the present invention is not limited to those precise embodiments, and that various other changes and modifications may be affected therein by one skilled in the art without departing from the scope or spirit of the present invention. All such changes and modifications are intended to be included within the scope of the invention as defined by the appended claims.

What is claimed is:

1. A method of manufacturing a semiconductor memory device, comprising the steps of:
   a) forming gate electrodes on a substrate having a cell region and a periphery region;
   b) forming a first insulating layer over the substrate, the first insulating layer covering the gate electrodes;
   c) forming first metal contact holes and stud holes in the first insulating layer, wherein the stud holes are aligned with corresponding one of the first metal contact holes;
   d) forming metal contact studs and first metal contact portions in the stud holes and the first metal contact holes, respectively;
   e) forming a second insulating layer on the first insulating layer and on the metal contact studs;
   f) forming bit line contact holes passing through the first and second insulating layers;
   g) forming bit line contacts in the bit line contact holes; and
   h) forming bit lines on the second insulating layer, wherein the metal contact studs are formed having a width that is greater than a space between adjacent bit lines.

2. The method of claim 1, further comprising the steps of:
   i) forming a capacitor over the cell region of the substrate;
   j) forming a third insulating layer over the substrate, said third insulating layer covering the bit lines;
   k) forming second metal contact holes in the second and third insulating layers, the second metal contact holes exposing a portion of the metal contact studs; and
   l) forming second metal contacts in the second metal contact holes.

3. The method of claim 1, wherein the step of forming the stud holes further comprises the steps of:
   forming a first photoresist pattern on the first insulating layer;
   isotropically and partially etching the first insulating layer using the first photoresist pattern as an etching mask to form the stud holes;
   anisotropically etching the first insulating layer using the first photoresist pattern as an etching mask to form the first metal contact holes which are narrower than the stud holes; and
   removing the first photoresist pattern.

4. The method of claim 1, wherein the first metal contact holes are formed using anisotropic etching processing to expose a portion of an active area and at least one of said gate electrodes.

5. The method of claim 1, wherein the step of (d) further comprises the steps of:
   depositing a first conductive material layer on the first insulating layer, wherein said first conductive material layer fills the stud holes and the first metal contact holes; and
   removing a portion of the first conductive material layer to form the metal contact studs and the first metal contact portions.

6. The method of claim 1, wherein the step of (e) further comprises the step of planarizing the second insulating layer using a chemical mechanical polishing (CMP) technique.

7. The method of claim 1, wherein the step of (f) further comprises the steps of:
   forming a second photoresist pattern on the second insulating layer; and
   etching the first and second insulating layers to form the bit line contact holes using the second photoresist pattern as a mask, wherein after the bit line contact holes are formed, the second photoresist pattern is removed.

8. The method of claim 1, wherein the step of (g) further comprises the steps of:
   depositing a second conductive material layer on the second insulating layer, the second conductive material layer filling the bit line contact holes; and
   removing a portion of the second conductive material layer on the second insulating layer.

9. The method of claim 1, wherein step (h) further comprises the steps of:
   depositing a third conductive material layer on the second insulating layer, wherein the third conductive material layer contact the bit line contacts; and patterning the third conductive material layer to form the bit lines.

10. The method of claim 1, wherein an area of a lower portion of each metal contact stud is less than an area of an upper portion of each metal contact stud.

11. The method of claim 2, wherein step (k) further comprises the steps of:
    forming third photoresist patterns on the third insulating layer;
    etching the third insulating layer and the second insulating layer using the third photoresist patterns as a mask to form the second metal contact holes, wherein each of the second metal contact holes pass through between the adjacent bit lines and exposes a portion of the metal contact studs.

12. The method of claim 2, wherein step (l) further comprises the steps of:
    depositing a fourth conductive material layer on the third insulating layer, the fourth conductive material layer filling the second metal contact holes; and
    removing a portion of the fourth conductive material layer on the third insulating layer to form the second metal contacts.

13. The method of claim 8, wherein at least one of the bit line contacts is connected to active area of the substrate.

14. The method of claim 8, wherein at least one of the bit line contacts is connected to one of the gate electrodes.

15. A method of manufacturing a semiconductor memory device, comprising the steps of:
    forming lower portions of metal contacts and metal studs in a first insulating layer disposed on a substrate having gate electrodes, wherein each of the metal studs is aligned with corresponding one of the lower portions of the metal contacts;
    forming a second insulating layer on the first insulating layer and on the metal studs;
    forming bit line contacts that pass through the first and the second insulating layers;
    forming bit lines on the second insulating layer and in contact with the bit line contacts;
    forming a third insulating layer on the second insulating layer and the bit lines; and
    forming upper portions of the metal contacts that pass through the second and the third insulating layers, wherein each of the upper portions of the metal contacts is in contact with one of the metal studs and is disposed between adjacent bit lines, and wherein each of the metal contact studs is farmed having a width that is greater than a space between adjacent bit lines.

16. The method of claim 15, wherein the step of forming lower portions of metal contacts and metal studs in a first insulating layer:
    forming a first photoresist pattern on the first insulating layer; and
    etching stud holes in the first insulating layer using the first photoresist pattern as a mask.

17. The method of claim 16, further comprising steps of:
    forming lower contact holes for the lower portions of the metal contacts using anisotropic etching process within an area of the stud holes such that a width of the lower contact holes is narrower than a width of the stud holes.

18. The method of claim 17, wherein the anisotropic etching process exposes a portion of an active area and at least one of said gate electrodes, and wherein after the lower contact holes for the lower portions of the metal contacts are formed, the first photoresist pattern is removed.

19. The method of claim 18, further comprising the steps of:
    depositing a conductive material layer on the first insulating layer, wherein the conductive material layer fills the stud holes and the lower contact holes; and
    removing a portion of the conductive material layer to form the metal contact studs and the lower portions of the metal contacts such that a surface of the first insulating layer and a surface of the metal contact studs are exposed, wherein the surface of the first metal contact studs is substantially co-planner with the surface of the first insulation layer.

20. The method of claim 15, wherein forming the upper portions of the metal contacts further comprises the steps of:
    forming third photoresist patterns on the third insulating layer;
    etching the third insulating layer and the second insulating layer using the third photoresist patterns as a mask to form upper contact holes for the upper portions of the metal contact holes, wherein each of the upper contact holes is disposed between the adjacent bit lines and exposes a portion of one of the metal contact studs;
    depositing a conductive layer on the third insulating layer, the conductive layer filling the upper contact holes; and
    removing a portion of the conductive layer on the third insulating layer to form the upper portions of the metal contacts.

* * * * *